(12) United States Patent
Oh

(10) Patent No.: US 6,334,641 B1
(45) Date of Patent: Jan. 1, 2002

(54) GRIPPER FOR A SURFACE MOUNTING APPARATUS

(75) Inventor: Tae Seok Oh, Seoul (KR)

(73) Assignee: Mirae Corporation, Choongchungnam-do (KR)

( * ) Notice: Subject to any disclaimer, the term of this patent is extended or adjusted under 35 U.S.C. 154(b) by 0 days.

(21) Appl. No.: 09/479,899

(22) Filed: Jan. 10, 2000

(30) Foreign Application Priority Data

Feb. 6, 1999 (KR) .............................................. 99-4084

(51) Int. Cl.⁷ ................................................ B25J 15/08
(52) U.S. Cl. ...................................... 294/119.1; 294/88
(58) Field of Search ............................ 294/2, 88, 119.1, 294/115, 116; 901/37; 269/34, 229, 234

(56) References Cited

U.S. PATENT DOCUMENTS

| | | | |
|---|---|---|---|
| 3,108,835 A | * 10/1963 | Rowekamp | ................. 294/116 |
| 3,170,322 A | * 2/1965 | Cavanaugh | ............. 294/119.1 |
| 4,034,542 A | * 7/1977 | Loehr | ........................ 294/116 |
| 4,426,869 A | * 1/1984 | Farmer et al. | ............. 294/116 |
| 4,705,313 A | * 11/1987 | Radice | .................... 294/119.1 |
| 4,839,961 A | 6/1989 | Vermeer | |
| 5,007,796 A | * 4/1991 | Sticht | ....................... 294/116 |
| 5,330,241 A | * 7/1994 | Takahashi | ................... 294/116 |
| 5,762,391 A | * 6/1998 | Sumnitsch | .............. 294/119.1 |

FOREIGN PATENT DOCUMENTS

| | | | | |
|---|---|---|---|---|
| DE | 290-382 | * | 5/1991 | ............. 294/119.1 |
| DE | 4320071 | * | 1/1994 | ............. 294/119.1 |

* cited by examiner

*Primary Examiner*—Dean J. Kramer
(74) *Attorney, Agent, or Firm*—Fleshner & Kim, LLP

(57) ABSTRACT

A gripper for a surface mounting apparatus is provided. The gripper includes a gripper holder having an air through hole formed in a central portion of the gripper holder, a gripper adapter positioned below the gripper holder to which one end of a tension spring is fixed, a gripper piston rod provided inside the gripper holder and configured to be upwardly and downwardly moved by air supplied through the air through hole, a pair of jaws provided inside the gripper adapter, the jaws being movably disposed with respect to each other, the other end of the tension spring being fixed to the pair of jaws, a gripper tooth adapter fixed at an upper portion of the jaws by way of a fixing device, a gripper tooth assembly attached to an upper portion of the gripper tooth adapter, the gripper tooth assembly being configured to hold an electronic component, a shaft provided between the pair of jaws and fixed to the gripper piston rod, and a roller coupled to the shaft. The gripper may further include a cam coupled to the shaft.

18 Claims, 3 Drawing Sheets

GRIPPER FOR A SURFACE MOUNTING APPARATUS

BACKGROUND OF THE INVENTION

1. Field of the Invention

The invention relates to a gripper for a surface mounting apparatus. More particularly, the invention relates to a gripper for a surface mounting apparatus which can easily and stably hold larger electronic components which are insufficiently sucked by a nozzle during surface mounting operations, or any components frequently causing a glitch in suctioning thereof.

2. Description of the Conventional Art

In developing electric and electronic components for recent electronic products, the trend is toward higher density, smaller size and various types of components, for which the development is becoming highly competitive. In particular, a printed circuit board, which is used for mounting the electric and electronic components thereon by a surface mounting apparatus, employs surface mounting technology. The use of such a technology is becoming popular.

A surface mounting assembly equipment typically has, as a core apparatus, the surface mounting apparatus for mounting the surface mounting components onto the printed circuit board. The surface mounting apparatus receives the various types of surface mounting components from a part feeder, transfers the components to the component mounting positions, then performs the mounting of the components on the printed circuit board.

Surface mounting apparatuses are classified into two types of apparatuses, i.e., high speed apparatus and general purpose apparatus, depending upon the function thereof. The former one is designed to assemble a great deal of components in a relatively short time period, thus resulting in a faster component mounting operation suitable for mass production. However, this type of apparatus has a drawback of reduced mounting precision. The latter one is adapted to mount various types of components, thus resulting in higher mounting precision and the feasibility of mounting various components. The general purpose apparatus has the advantage of a smaller amount of production for various components, but the drawback is its lower throughput caused by the reduction in production.

The surface mounting apparatus consists of a feeder (hereinafter, referred to as 'tape feeder') for supplying components, an X-Y gantry for determining operating positions, a conveyer for carrying a printed circuit board, a header unit for orderly picking up the components from the tape feeder and mounting the same onto the printed circuit board.

The term "surface mounting apparatus" generally refers to an apparatus adapted to mount electronic components, including various chips, onto a printed circuit board, and is also called a "mounter."

The surface mounting apparatus thus structured is equipped with a nozzle for vacuum sucking electronic components and semiconductor devices different in size, or a gripper for holding the components. The components sucked by the nozzle or held in the gripper are to be mounted on the printed circuit board.

However, in order to hold larger components or semiconductor devices, it is necessary to use a gripper adapted to hold large components, and if another kind of electronic components is selected, then the mounting operation stops in order to exchange one gripper with another gripper for holding the different component, which causes the process time to be delayed. Thus, there is a problem in that productivity is reduced.

SUMMARY OF THE INVENTION

Therefore, it is an object to provide a gripper for a surface mounting apparatus which can easily and stably hold electronic components using vacuum pressure in order to hold larger electronic components insufficiently sucked by a nozzle during surface mounting operation or any components that frequently cause a glitch in the suction thereof.

The above object is accomplished by a gripper for a surface mounting apparatus according to the invention. The gripper comprises a gripper holder having an air through hole formed at a central portion of the gripper holder, a gripper adapter coupled to the gripper holder and having at one side thereof a fixing hole for fixing one end of a tension spring, a gripper piston rod inserted inside the gripper holder and configured to be upwardly and downwardly moved by air supplied through the air through hole, a pair of jaws provided inside the gripper adapter, the jaws being symmetrically and movably disposed with respect to each other, and having a fixing bar to which the other end of the tension spring is fixed, a gripper tooth adaptor fixed at an upper portion of the jaws by way of fixing means, a gripper tooth fixed at an upper portion of the gripper tooth adapter by fixing means, and for holding the electronic components, a shaft provided between the jaws, and fixed to one end portion of the gripper piston rod, a cam inserted onto and coupled to the shaft, and a roller coupled to both ends of the shaft to face the cam.

DETAILED DESCRIPTION OF THE INVENTION

A gripper for a surface mounting apparatus according to the invention is described in detail, referring to the accompanying drawings.

Figure 1:
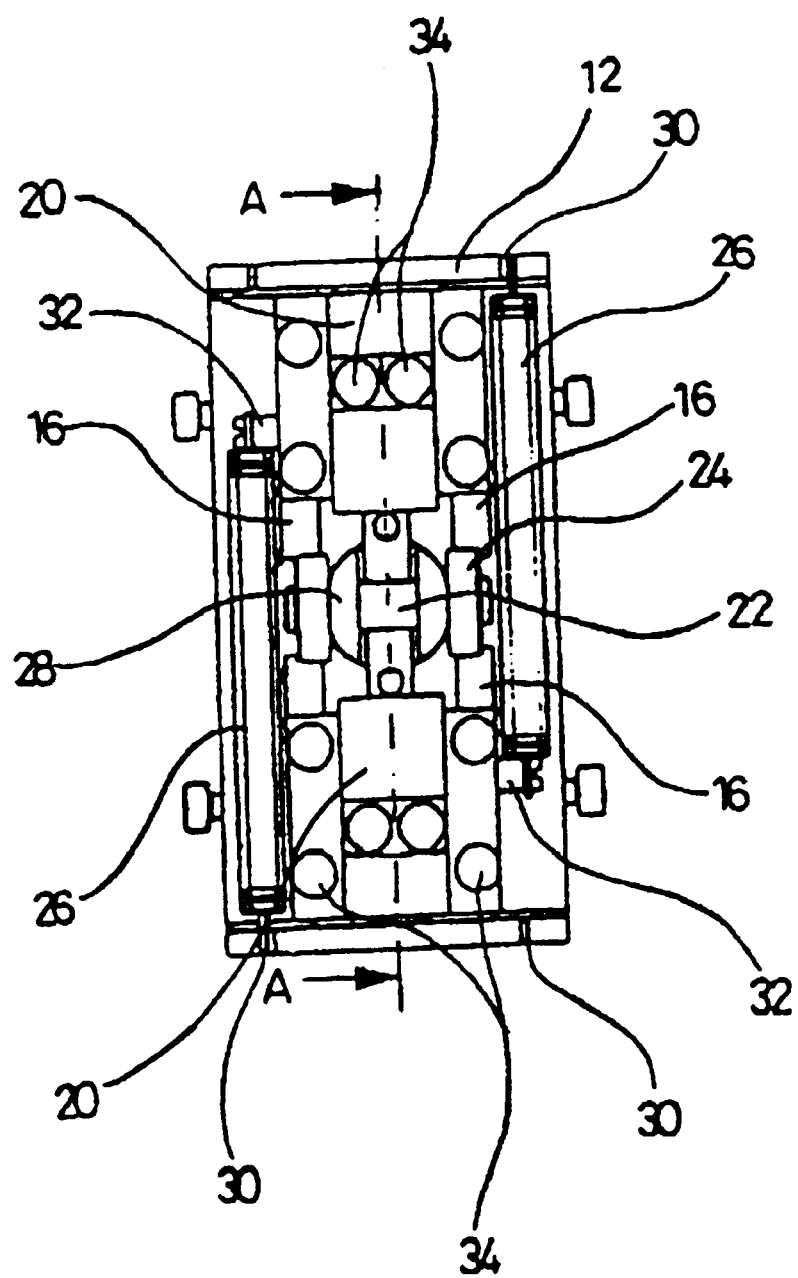
FIG. 1 depicts a plan view showing a gripper for the surface mounting apparatus in accordance with the invention.
Figure 2:
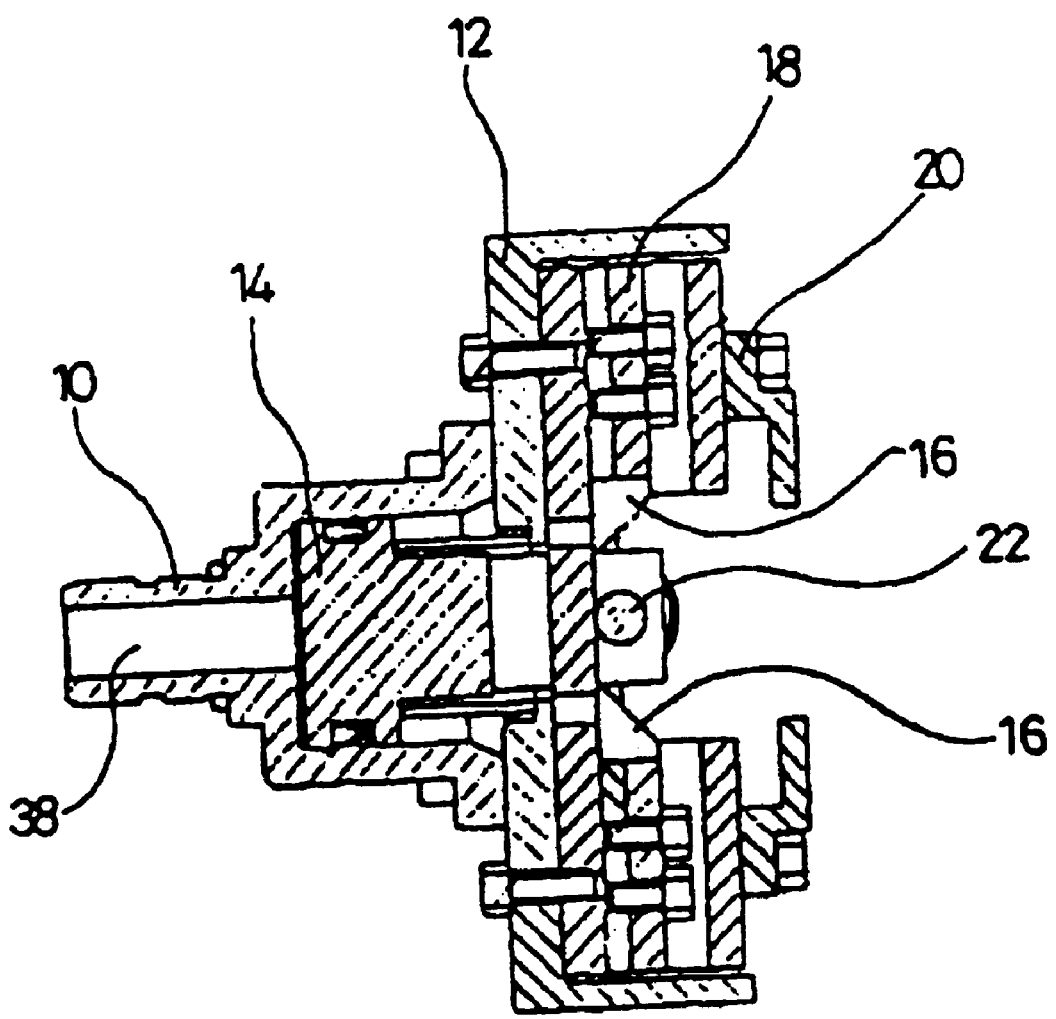
FIG. 2 depicts a sectional view taken along line A—A of FIG. 1.
Figure 3:
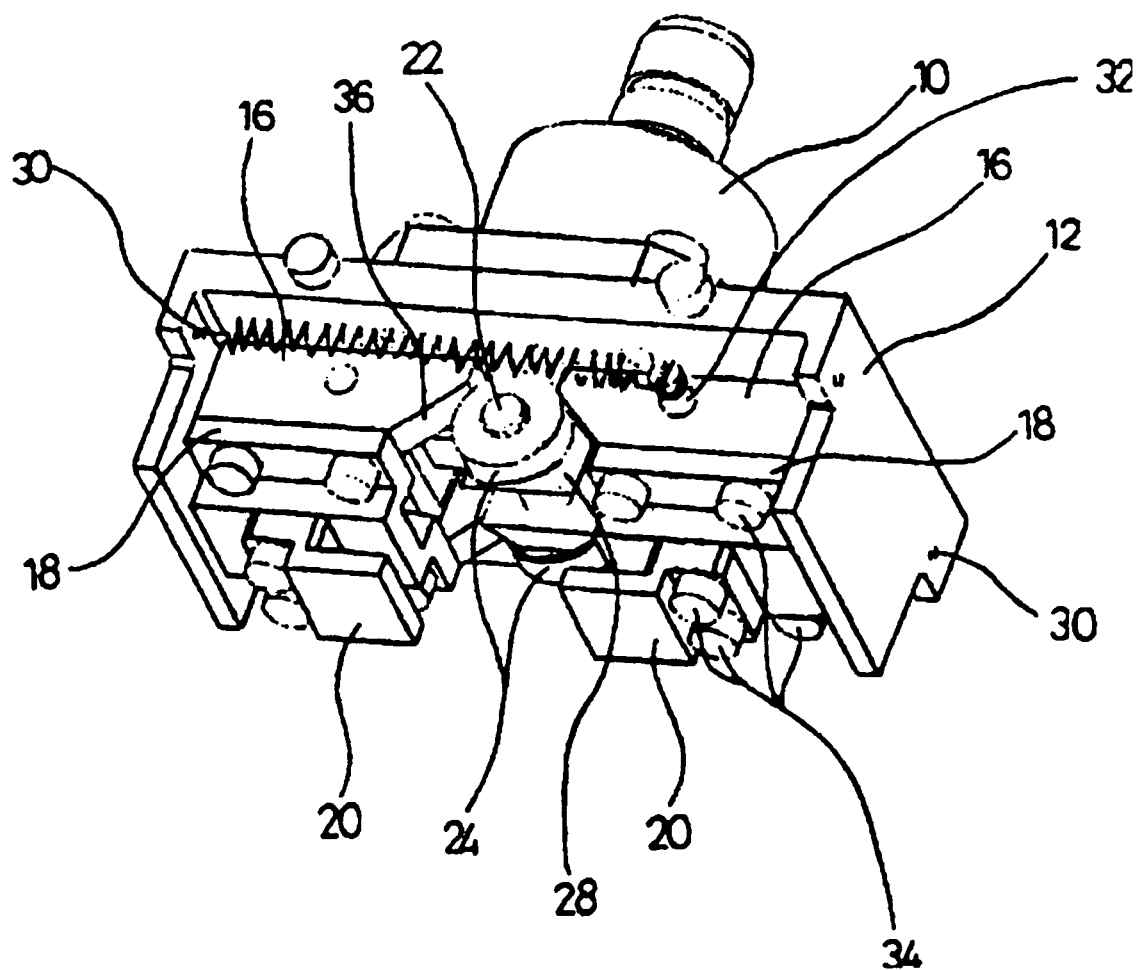
FIG. 3 depicts a perspective vew of a gripper according to the invention.

FIG. 1 depicts a plan view showing a gripper for a surface mounting apparatus in accordance with the invention. FIG. 2 depicts a sectional view taken along line A—A of FIG. 1. FIG. 3 depicts a perspective view of the gripper according to the invention.

Referring to FIGS. 1 to 3, the gripper for the surface mounting apparatus according to the invention has a gripper holder 10 having an air through hole 38 formed in a central portion of the gripper holder 10. A gripper adapter 12 is positioned below the gripper holder 10 and has a side surface in which a fixing hole 30 is formed. One end of a tension spring 26 is fixed into the fixing hole 30. A gripper piston rod 14 is provided inside the gripper holder 12 through a central portion of the gripper adapter 12. The gripper piston rod 14 is moved upwardly and downwardly by air supplied though the air through hole 38. A pair of jaws, 16, 16 is provided inside the gripper adapter 12. The pair of jaws are symmetrically and movably disposed with respect to each other, and have a fixing bar 32 to which the other end of the tension spring 26 is fixed. A gripper tooth adapter 18, 18 is fixed on an upper portion of each of the pair of jaws 16, 16 by way of fixing means 34, 34. A pair of gripper teeth 20, 20 are fixed at an upper portion of the gripper tooth adapter 18 by fixing means 34, 34. The pair of gripper teeth 20, 20 are configured to hold an electronic component. A shaft 22 is provided between the pair of jaws 16, 16 symmetrically disposed with respect to each other, and is fixed to one end portion of the gripper piston rod 14. A cam 28, 28 is inserted onto and is coupled to each end of the shaft 22. A roller 24, 24 is coupled to both ends of the shaft 22 to face an outside surface of the respective cam 28, 28.

Further, the pair of jaws 16, 16 symmetrically disposed with respect to each other, each has a slant surface 36, 36 formed at a front surface portion thereof.

Referring to FIGS. 1 to 3, the structure of the gripper according to the invention will be described in detail as follows. The gripper holder 10 has a central portion provided with an air through hole 38 for supplying air therethrough, and a lower part provided with a gripper adapter 12 shaped like a 'U'. A gripper piston rod 14 is inserted through a central portion of the gripper adapter 12 and into the air through hole of the gripper holder 10. Further, the gripper adapter 12 is formed by bending both sides of the gripper adapter 12. Each side of the gripper adapter 12 has a fixing hole 30 into which one end of a tension spring 26 is fixed.

The pair of jaws 16, 16, configured to be horizontally movable are provided inside the gripper adapter 12. The pair of jaws 16, 16 has the fixing bar 32 formed on one side surface thereof, to which the other end of the tension spring 26 is fixed. Moreover, the pair of jaws 16, 16 each has the slant surface 36 at the front surface portion thereof and can be pulled by an action of the tension spring 26 having one end fixed at the gripper holder 10.

On a surface upper portion of the pair of the jaws 16, 16 a gripper tooth adapter 18, 18 is fixedly provided by fixing means 34, 34. A pair of gripper teeth 20, 20 each shaped like "ϛ" in its side section, is used to hold the electronic part. Each gripper tooth 20, 20 fixedly engages with the top surface of the gripper tooth adapter 18 by fixing means 34, 34. Further, as shown in FIG. 2, a shaft 22 is inserted through a lower end portion of the gripper piston rod 14 accommodated insider the gripper holder 10. Semi-circle shaped cams 28 are inserted onto and fixed to both ends of the shaft 22. The rollers 24, 24 facing the slant surfaces 36, 36 of the pair of jaws 16, 16 is positioned outside the cams 28, 28 to maintain a gap between the jaws.

The operation of the gripper thus structured in accordance with the invention will be described in detail.

External air is supplied through an air through hole 38 of the gripper holder 10 to create vacuum pressure causing the gripper piston rod 14 to be moved upward and downward.

When the gripper piston rod 14 is moved downward, the rollers 24, 24 are moved therewith, which is fixed at both ends of the shaft 22 engaged at the lower part of the rod. As the rollers 24, 24 descend, the tension spring 26 pulls the pair of jaws 16, 16 and the gap between the jaws 16, 16 becomes gradually narrowed. As the gap formed between the pair of jaws 16, 16 becomes narrowed, the roller 24 ascends along the slant surfaces 36 of the jaws 16. The gripper teeth 20, 20 fixed at the lower part of the pair of jaws 16, 16 correspondingly approach each other to hold the electronic part.

Also, when the gripper piston rod 14 is moved upward by vacuum pressure created externally, the cams 28, 28 provided at both ends of the shaft 22 press the slant surfaces 36, 36. The pressure widens the gap between jaws 16.

The gripper teeth 20, 20 are also moved in left and right directions, respectively, to be opened. The gripper teeth 20, 20 thus widened apart can hold another electronic part.

If the pressure applied to the gripper piston rod 14 is released after the pair of jaws 16, 16 and the gripper teeth 20, 20 are widened apart, the tension spring 26 then pulls the pair of jaws 16, 16, which causes the gripper teeth 20, 20 fixed to the pair of jaws 16, 16 to be moved forward to their initial positions at which the electronic part can be taken therefrom.

The invention thus constructed is applicable to various kinds of electronic parts.

As discussed above, the gripper for the surface mounting apparatus in accordance with the invention provides the advantage that parallel movement of the pair of jaws only needs a small space, no damage to the electronic part occurs, and the invention is applicable to semiconductor devices as well as to various sizes of electronic components, thereby further enhancing operation efficiency.

What is claimed is:

1. A gripper for a surface mounting apparatus, comprising:
    a gripper holder having an air through hole formed at a central portion of the gripper holder;
    a gripper adapter coupled to the gripper holder and having at sides thereof fixing holes for fixing one end of a tension spring;
    a gripper piston rod inserted inside the gripper holder and configured to be upwardly and downwardly moved by air supplied through the air through hole;
    a pair of jaws attached to the gripper adapter, the pair of jaws being symmetrically and movably disposed with respect to each other, and each having a fixing bar to which the other end of a tension spring is fixed;
    a gripper tooth adapter fixed at an upper portion of each of the jaws by way of fixing means;
    a gripper tooth fixed at an upper portion of each of the gripper tooth adapters by the fixing means, the gripper teeth being configured to hold an electronic component;
    a shaft provided between the jaws, and fixed to one end portion of the gripper piston rod;
    a cam coupled to the shaft; and
    a roller coupled to both ends of the shaft to face the cam.

2. The gripper as defined in claim 1, wherein each of the jaws has a slant surface at the front portion thereof.

3. The gripper as defined in claim 1, wherein each gripper tooth has a step-like shape.

4. A gripper for a surface mounting apparatus, comprising:
    a gripper holder having a through hole formed therein;
    a gripper piston rod disposed within the gripper holder and configured to be upwardly and downwardly moved within the gripper holder;
    a gripper adapter coupled to the gripper holder;
    a pair of biasing members having first ends attached to the gripper adapter; and
    a pair of jaws disposed within the gripper adapter and configured to hold an electronic component, the pair of jaws being movably disposed with respect to each other, second ends of the pair of biasing members being attached to respective ones of the pair of jaws, wherein the jaws include slanted surfaces that contact a lower end of the gripper piston rod, wherein the jaws are configured such that upward movement of the gripper piston rod acts against the slanted surfaces of the jaws to cause the jaws to move apart, and wherein the biasing members are configured to bias the jaws toward one another.

5. The gripper as defined in claim 4, further comprising a cam assembly coupled to the shaft.

6. The gripper as defined in claim 4, wherein the gripper adapter includes fixing holes configured to receive the first ends of the biasing members.

7. The gripper as defined in claim 4, wherein each of the jaws includes a gripper tooth configured to hold a specific type of electronic component, and wherein the gripper tooth is removably mounted on the jaw.

8. The gripper as defined in claim 7, wherein each gripper tooth has a step-like shape.

9. The gripper as defined in claim 7, wherein each gripper tooth is attached to an upper portion of one of the jaws via fixing means.

10. The gripper as defined in claim 4, wherein the through hole is an air through hole and wherein the gripper piston rod is configured to be upwardly moved within the gripper holder by the application of a vacuum to the air through hole.

11. The gripper as defined in claim 4, wherein the pair of jaws are symmetrically disposed with respect to each other.

12. The gripper as defined in claim 4, wherein the gripper holder is configured to be inserted into a vacuum nozzle holder of a mounting machine, and wherein application of a vacuum to through hole of the gripper holder causes the jaws to open to receive an electronic component.

13. A gripper for a surface mounting apparatus, comprising:
- a gripper holder having a through hole formed therein;
- a gripper piston rod disposed within the gripper holder and configured to be upwardly and downwardly moved within the gripper holder;
- a gripper adapter coupled to the gripper holder;
- a pair of biasing members having first ends attached to the gripper adapter; and
- a pair of jaws disposed within the gripper adapter and configured to hold an electronic component, the pair of jaws being movably disposed with respect to each other, second ends of the pair of biasing members being attached to respective ones of the pair of jaws, wherein the jaws include slanted surfaces that contact a lower end of the gripper piston rod, wherein the jaws are configured such that upward movement of the gripper piston rod acts against the slanted surfaces of the jaws to cause the jaws to move apart, and wherein each of the jaws includes a fixing bar to which the second ends of the biasing members are attached.

14. A gripper for a surface mounting apparatus, comprising:
- a gripper holder having a through hole formed therein;
- a gripper piston rod disposed within the gripper holder and configured to be upwardly and downwardly moved within the gripper holder;
- a gripper adapter coupled to the gripper holder;
- a pair of biasing members having first ends attached to the gripper adapter; and
- a pair of jaws disposed within the gripper adapter and configured to hold an electronic component, the pair of jaws being movably disposed with respect to each other, second ends of the pair of biasing members being attached to respective ones of the pair of jaws, wherein the jaws include slanted surfaces that contact a lower end of the gripper piston rod, wherein the jaws are configured such that upward movement of the gripper piston rod acts against the slanted surfaces of the jaws to cause the jaws to move apart, and wherein the biasing members comprise tension springs.

15. A gripper for a surface mounting apparatus, comprising:
- a gripper holder having a through hole formed therein;
- a gripper piston rod disposed within the gripper holder and configured to be upwardly and downwardly moved within the gripper holder;
- a gripper adapter coupled to the gripper holder;
- a pair of biasing members having first ends attached to the gripper adapter; and
- a pair of jaws disposed within the gripper adapter and configured to hold an electronic component, the pair of jaws being movably disposed with respect to each other, second ends of the pair of biasing members being attached to respective ones of the pair of jaws, wherein the jaws include slanted surfaces that contact a lower end of the gripper piston rod, wherein the jaws are configured such that upward movement of the gripper piston rod acts against the slanted surfaces of the jaws to cause the jaws to move apart, wherein a roller assembly is mounted on a lower end of the gripper piston rod, and wherein the roller assembly is configured to act on the slanted surfaces of the jaws to cause movement of the jaws.

16. A gripper for an electronic mounting apparatus, comprising:
- a gripper holder having a through hole formed therein;
- a shaft mounted in the through hole of the gripper holder and configured to be moved upward and downward in the through hole by air pressure;
- a pair of jaws movably mounted on the gripper holder such that the jaws can move toward and away from each other, wherein slanted surfaces are formed on each of the jaws, and wherein the slanted surfaces are configured to interact with a lower portion of the shaft such that upward and downward movement of the shaft will cause the jaws to move with respect to each other; and
- a biasing device coupled to the jaws, wherein the biasing device is configured to bias the jaws towards each other, and wherein upward movement of the shaft causes the jaws to move away from each other.

17. The gripper as defined in claim 16, wherein the gripper holder is configured to be inserted into a vacuum nozzle holder of a mounting machine, and wherein application of a vacuum to the gripper holder causes the shaft to move upward.

18. The gripper of claim 16, wherein at least one gripper tooth is removably mounted on each jaw, and wherein the at least one gripper tooth is configured to grasp a particular type of electronic component.

* * * * *